May 3, 1966 R. H. BERNEIKE ETAL 3,249,883

A.C. COUPLED PULSE AMPLIFIER WITH FLOATING INPUT AND GROUNDED OUTPUT

Filed June 26, 1963 4 Sheets-Sheet 1

INVENTORS
KARL HINRICHS
BY RUDOLPH H. BERNEIKE
RICHARD L. DURRETT

Samuel B. Stone
ATTORNEY

May 3, 1966 R. H. BERNEIKE ETAL 3,249,883

A.C. COUPLED PULSE AMPLIFIER WITH FLOATING INPUT AND GROUNDED OUTPUT

Filed June 26, 1963 4 Sheets-Sheet 2

INVENTORS
KARL HINRICHS
BY RUDOLPH H. BERNEIKE
RICHARD L. DURRETT

Samuel B. Stone
ATTORNEY

INVENTORS
KARL HINRICHS
BY RUDOLPH H. BERNEIKE
RICHARD L. DURRETT
Samuel B. Stone
ATTORNEY INVENTORS
KARL HINRICHS
RUDOLPH H. BERNEIKE
RICHARD L. DURRETT
BY Samuel B. Stone
ATTORNEY United States Patent Office 3,249,883

Patented May 3, 1966

3,249,883

A.C. COUPLED PULSE AMPLIFIER WITH FLOATING INPUT AND GROUNDED OUTPUT

Rudolph H. Berneike, Yorba Linda, Richard L. Durrett, Los Angeles, and Karl Hinrichs, Fullerton, Calif., assignors to Beckman Instruments, Inc., a corporation of California Filed June 26, 1963, Ser. No. 290,779
11 Claims. (Cl. 330—14)

This invention relates to electrical signal amplifiers and more particularly to a wide-band low pass pulse amplifier for the precision amplification of signals having a frequency range from zero to a high frequency.

In the area of low level measurements, and particularly in low level commutator or multiplexer systems, it is essential that the amplifiers employed be highly accurate in all respects, i.e., highly accurate for level (linearity), for frequency (gain-bandwidth), etc., and be fast in operation. A high input impedance is necessary to avoid excessive loading of the input device, such as a transducer. Virtually complete conductive and electrostatic isolation between the input and the output of the amplifier is required to achieve high common mode rejection.

Heretofore multiplexing arrangements including a plurality of data channels have been provided in which each channel includes means for conductively and electrostatically isolating the input of each channel from the output thereof. With such an arrangement, the input of a channel is floating or connected to some point, possibly remote, the potential of which is variably different from the measurement system central ground; whereas, the output of the channel is connected to system central ground. Such schemes utilize an amplifier for each channel, with isolation being provided by shielded transformers. However, it is desirable to avoid the use of an amplifier in each channel because of the high cost involved for multi-channel systems. Previous attempts to provide a single amplifier suitable for use with high accuracy multiplexer systems have been unsuccessful for numerous reasons, among which are the problems of providing a sufficiently accurate amplifier while maintaining conductive and electrostatic isolation, and providing high common mode rejection.

Accordingly, it is a feature of the present invention to provide an amplifier for the precise amplification of signals in a range from D.C. to thousands of cycles per second having conductive and electrostatic isolation between the input and the output thereof and which operates accurately in a multi-channel multiplexer system.

According to a further feature of the present invention a wide-band low pass pulse amplifier is provided in which the input may be floating with respect to the output, and which is relatively simple in construction and reduced in cost.

An additional feature of the present invention is the provision of a wide-band pulse amplifier having only electromagnetic coupling between the input and output thereof and which is characterized by high input impedance, rapid response and freedom from systematic noise.

A further feature of the present invention is the provision of a wide-band low pass pulse amplifier for the precision amplification of pulse signals having a frequency range from zero to a high frequency and which is characterized by high input impedance, freedom from systematic noise and simplicity of design.

Basically, a pulse amplifier constructed in accordance with the teachings of the present invention includes an input circuit coupled through an error junction transformer and an amplifier to an output circuit. A transformer coupled feedback circuit is provided between the input and output circuits, and switches are coupled in various parts of the circuits to provide the desired operation.

In a specific exemplary embodiment of a pulse amplifier utilizing the concepts of the present invention, an input circuit is transformer coupled to a preamplifier. The preamplifier is coupled through a storage device to a post amplifier, the output of which is the output of the over-all pulse amplifier. Feedback is provided from the output of the pulse amplifier to the input circuit by means of transformer coupling. The input circuit, feedback circuit and post amplifier have switches associated therewith which are operated in a desired sequence to establish references, amplify a pulse signal, and discharge any built-up excitation currents.

Other features and objects of the invention will be better understood from a consideration of the following detailed description when read in conjunction with the attached drawings in which.

Figures 1, 2:
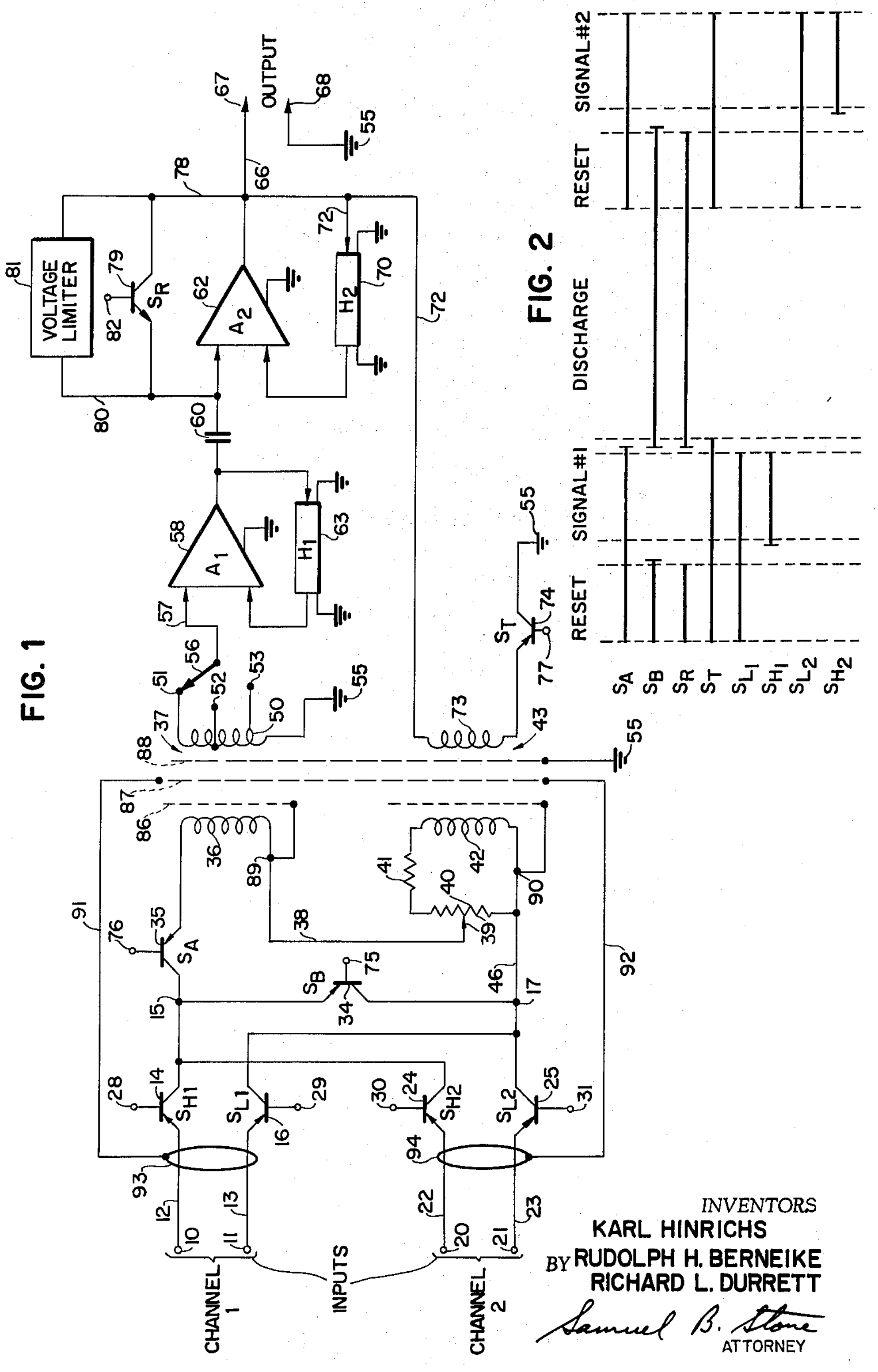
FIG. 1 illustrates in block diagram form a pulse amplifier constructed in accordance with the teachings of the present invention and having a multiplexer input.
FIG. 2 illustrates exemplary switching signals employed to control the switches illustrated in FIG. 1.

Referring now to the drawings, FIG. 1 illustrates an exemplary embodiment of a pulse amplifier connected with a portion of a multiplexer, or commutator, system. Two channels, channel 1 and channel 2, are illustrated; however, many more channels usually are employed. Channel 1 includes input terminals 10 and 11 which are connected to respective lines or buses 12 and 13. The upper line 12 (may be termed an H bus) is connected through the emitter-collector path of a PNP transistor 14 to a terminal 15 which may be considered as a first input to the pulse amplifier. The lower line 13 (which may be termed an L bus) is connected through the emitter-collector path of a PNP transistor 16 to a terminal 17 which may be considered as a second input to the pulse amplifier.

In a similar manner, channel 2 includes input terminals 20 and 21 connected to respective lines 22 and 23 (H2 and L2 buses). The line 22 is connected through the emitter-collector path of a PNP transistor 24 to the input terminal 15 of the pulse amplifier. The line 23 is connected through the emitter-collector path of a PNP transistor 25 to the input terminal 17 of the pulse amplifier. The transistors 14, 16, 24 and 25 function as switches and are respectively termed switches $S_{H1}$, $S_{L1}$, $S_{H2}$ and $S_{L2}$. Terminals 28 through 31 are connected to the respective bases of the transistors 14, 16, 24 and 25 to apply a control voltage for operating the switches.

A PNP transistor 34, termed switch $S_B$, has its emitter-collector path connected across the input terminals 15 and 17 of the pulse amplifier. The terminal 15 is connected through the collector-emitter path of a PNP transistor 35, termed switch $S_A$, to an upper terminal of a primary winding 36 of an input or error junction transformer 37. A lower terminal of the primary winding 36 is connected through a line 38 to a variable tap 39 on a precision potentiometer 40. The potentiometer 40 and a precision resistance 41 are connected in series across a secondardy winding 42 of a feedback transformer 43. A lower terminal of the secondary winding 42 is connected with the input terminal 17 through a line 46.

The input transformer 37 includes a secondary winding 50 which has a plurality of taps 51 through 53. A lower terminal of the secondary winding 50 is connected to ground 55. A contact arm 56 is arranged to selectively engage any one of the taps 51 through 53, and is connected through a line 57 to an input of a preamplifier 58, termed amplifier $A_1$. The output of the preamplifier 58 is connected through a reset capacitor 60 to an input of a post amplifier 62, termed amplifier $A_2$. The output of the amplifier 58 also is connected through a feedback circuit 63, termed $H_1$, to a second input of the amplifier 58. The output of the amplifier 62 is connected through a line 66 to an output terminal 67. The output of the over-all pulse amplifier is taken between the terminal 67 and a terminal 68 which is connected to ground 55.

The output of the amplifier 62 also is connected through a line 72 and a feedback circuit 70, termed $H_2$, to a second input of the amplifier 62. Additionally, the output of the amplifier 62 is connected through the line 72 to an upper terminal of a primary winding 73 of the feedback transformer 43. A lower terminal of the primary winding 73 is connected through the emitter-collector path of PNP transistor 74, termed switch $S_T$ to ground 55. Terminals 75, 76 and 77 are connected to the bases of the respective transistors 34, 35 and 74 for applying switching control voltages thereto.

The output of the amplifier 62 is further connected through a line 78 and the collector-emitter path of a PNP transistor 79, termed switch $S_R$, to the upper input of the amplifier 62. The line 78 also is connected through a voltage limiter 81 and the line 80 to the upper input of the amplifier 62. A terminal 82 is connected to the base of the transistor 79 to apply a control voltage thereto. The function and operation of the switch $S_R$ and the voltage limiter 81 will be explained in greater detail subsequently.

Each of the transformers 37 and 43 includes three shields 86, 87 and 88. The shields 86, which may be termend inner floating guard shields, of each transformer 37 and 43 are connected to respective terminals 89 and 90. The shields 87, which may be termed transducer guard shields, are connected together, and connected through respective lines 91 and 92 to guard shields 93 and 94, respectively. The guard shields 93 and 94 shield the lines 12 and 13, and 22 and 23 of the respective channels 1 and 2, and are connected to the shield of the transducers, the signal terminals of which are connected to the respective input terminals of channels 1 and 2. The shield of a transducer normally is connected to transducer local ground. The shields 88, which may be termed system central ground shields or mecca shields, are tied together and connected to the system central ground 55.

Consideraing a single input channel, channel 1, the switches $S_{H1}$ and $S_{L1}$ are employed to connect an input signal from a transducer to the input terminals 15 and 17 of the pulse amplifier. The switch $S_A$ is an input switch and is employed to open the input circuit during a transformer discharge period, and to prevent switching transients associated with the switches $S_{H1}$ and $S_{L1}$ from entering the pulse amplifier. The switch $S_B$ is an input clamp switch and provides an input zero reference voltage against which the input signals are compared immediately after $S_B$ opens. The switch $S_T$ is a transformer discharge switch and is utilized along with switch $S_A$ to discharge the transformers at the end of a signal period in order to prevent build-up of excitation current. An excess excitation current would cause the feedback transformer 43 to become saturated, and would cause the error junction transformer 37 to circulate current in the input circuits which in turn would cause errors in the signal being amplified. The switch $S_R$ is a reset switch which allows reference voltages to be established in both the input and output circuitry when switches $S_B$ and $S_A$ are shut during the reset period.

There are three basic periods in the operation of the pulse amplifier shown in FIG. 1. They are: reset, signal, and discharge. During the reset period zero reference voltages are established in both the input and output circuitry. During the signal period the input signal, which is a short pulse or time slice of a channel input signal, is amplified. During the discharge period the transformers are discharged to prevent build-up of excitation current. FIG. 2 illustrates an exemplary timing diagram for the operation of the switches shown in FIG. 1. A horizontal line in FIG. 2 indicates that the switch is on, or closed. The absence of a line indicates that the switch is off, or open. The basic time periods of operation, reset, signal, and discharge are illustrated in FIG. 2 along with short periods in between which are switching periods. As an example of a typical operation, a reset period may be 25 microseconds, a first switching period 8 microseconds, a signal period 32 microseconds, a second switching period 4 microseconds, and a discharge period of 80 microseconds. These examples of lengths of the basic time periods are purely exemplary and other length periods may be utilized as desired.

Referring both to FIG. 1 and FIG. 2, the operation of the arrangement shown in FIG. 1 will be described throughout its three basic periods of operation. Zero reference voltages are established in both the input and output circuitry during the reset period by closing switches $S_A$, $S_B$, $S_R$, and $S_T$. It will be understood that these switches are opened or closed by applying appropriate voltages to the bases thereof. The specific means for accomplishing this control has not been shown since various devices and methods will suggest themselves to those skilled in the art. For example, flip-flop or toggles may be connected to the bases of the transistor switches and triggered by appropriate timing signals. At this time the switch $S_{L1}$ may also be closed. The capacitor 60 charges to an offset voltage of a value that gives an output voltage across the terminals 67 and 68 of zero, i.e., the capacitor 60 charges to a value equal to the voltage at the output of the preamplifier 58. Thus, a subsequently applied input signal from a transducer will be amplified differentially, so to speak, with the offset levels which were present during the reset period. The reset cycle is necessary since small but noticeable offset drifts occur over periods of time, and the reset operation establishes a new reference. Subsequently, the switches $S_B$ and $S_R$ are opened, and the switch $S_{H1}$ is closed. An input signal from a transducer connected to input terminals 10 and 11 of channel 1 is now applied to the pulse amplifier. This input signal which is a segment of the transducer signal is only present for a short interval of time as can be seen from the timing diagram in FIG. 2. The change in input voltage that occurs is amplified and appears across the output terminals 67 and 68 of the pulse amplifier. This signal, being amplified and available from the low-impedance output of the amplifier 62, is now utilized by a data-acquisition system in any of the many ways familiar to those skilled in the art.

At the end of the first signal period, the switches $S_{L1}$ and $S_{H1}$ are opened, and the switch $S_R$ is closed. The switch $S_A$ is opened and the switch $S_B$ is closed. The switch $S_T$ is opened. The discharge period now commences and the transformers 37 and 43 are discharged to prevent any buildup of excitation current. When sufficient discharge time has elapsed, the pulse amplifier is again reset and the next input signal (in this case, an input signal from channel 2) is applied to the pulse amplifier. The transient which occurs when switch $S_B$ is closed is equal and opposite to the one that occurs when the input signal is first applied (during the signal period) and may discharge practically all of the excitation current of the transformer 37.

In order to recapitulate the exemplary timing sequence shown in FIG. 2, the switches $S_B$ and $S_R$ may be assumed to be closed initially with the following operations occurring in a time sequence as indicated by the following numbers:

(1) $S_A$, $S_T$, $S_{L1}$ are closed;
(2) $S_R$ is opened;
(3) $S_B$ is opened;
(4) $S_{H1}$ is closed;
(5) $S_{L1}$ and $S_{H1}$ are opened;
(6) $S_R$ is closed, $S_A$ is opened (may occur at time 5 or 6), and $S_B$ is closed;
(7) $S_T$ is opened.

The next operation of switches commences the next reset period.

The preamplifier 58 has a low output impedance to allow rapid charging of the reset capacitor 60 during the reset period. The post amplifier 62 is an inverting amplifier which has a high input impedance in order that the capacitor 60 may have a small capacitance to give a fast reset time constant and yet not droop during the signal period. The amplifier 62 acts as an operational amplifier during reset. This amplifier also has a low offset voltage since the offset voltage thereof determines the accuracy of reset. The offset voltage of the amplifier 62 is initially adjusted to a low value during a reset period as will be discussed in greater detail subsequently in connection with a discussion of the circuits therein. Any offsets which result from the feedback circuit also are included in the charge applied to the capacitor 60 and, hence, do not result in errors when a new signal subsequently is amplified. Thus, it should be apparent that the purpose of the reset cycle is to set the output of the pulse amplifier to zero and to store a voltage on the reset capacitor which causes the zero output so that the subsequent input signals from a transducer will be referenced to this predetermined level during the signal period. The circuit is thus reset to compensate for the signal present on the input and not to ground as would be necessary without the preamplifier 58. During the signal period, the stored offset voltage is effectively subtracted from the resultant input signal (which includes the transducer input signal and offsets) to provide a true amplified replica of the actual transducer input signal.

The particular reset arrangement described provides a fast reset time constant. Additionally, the reset capacitor 60 is located remote from the input of the pulse amplifier so that any errors in the capacitor voltage are not amplified by the full gain of both amplifiers 58 and 62, but only by the post amplifier 62. The reset concepts described herein are further described and claimed in copending U.S. Patent Application Serial No. 290,780 entitled "A.C. Coupled Amplifier Offset Storage and Reset Circuit" filed by Richard L. Durrett concurrently herewith and assigned to the assignee of the present invention.

It should be noted that the series offset voltage of the transistor switches $S_{H1}$ and $S_{L1}$ should be adjusted to equal the offset of the transistor $S_B$ in order to prevent any offset from the former switches on the input signal.

It now should be apparent from a description of FIGS. 1 and 2 that the present invention provides for accurate amplification of pulse signals and employs shielded transformers to float the input circuit without the use of conventional modulator and demodulator circuits to achieve direct current stability. This provides for simplicity of design because D.C. stability is not required. Additionally, the amplifier has high input impedance and is free from systematic, i.e., mechanical chopper, noise. Another advantage is the consequent absence of intermodulation noise of stabilization devices with the input pulses or the pulse train. A further advantage is the absence of large stored energies in a stabilization circuit which might be caused by an overscale input signal on one or more of the input channels.

Figures 3, 3A:
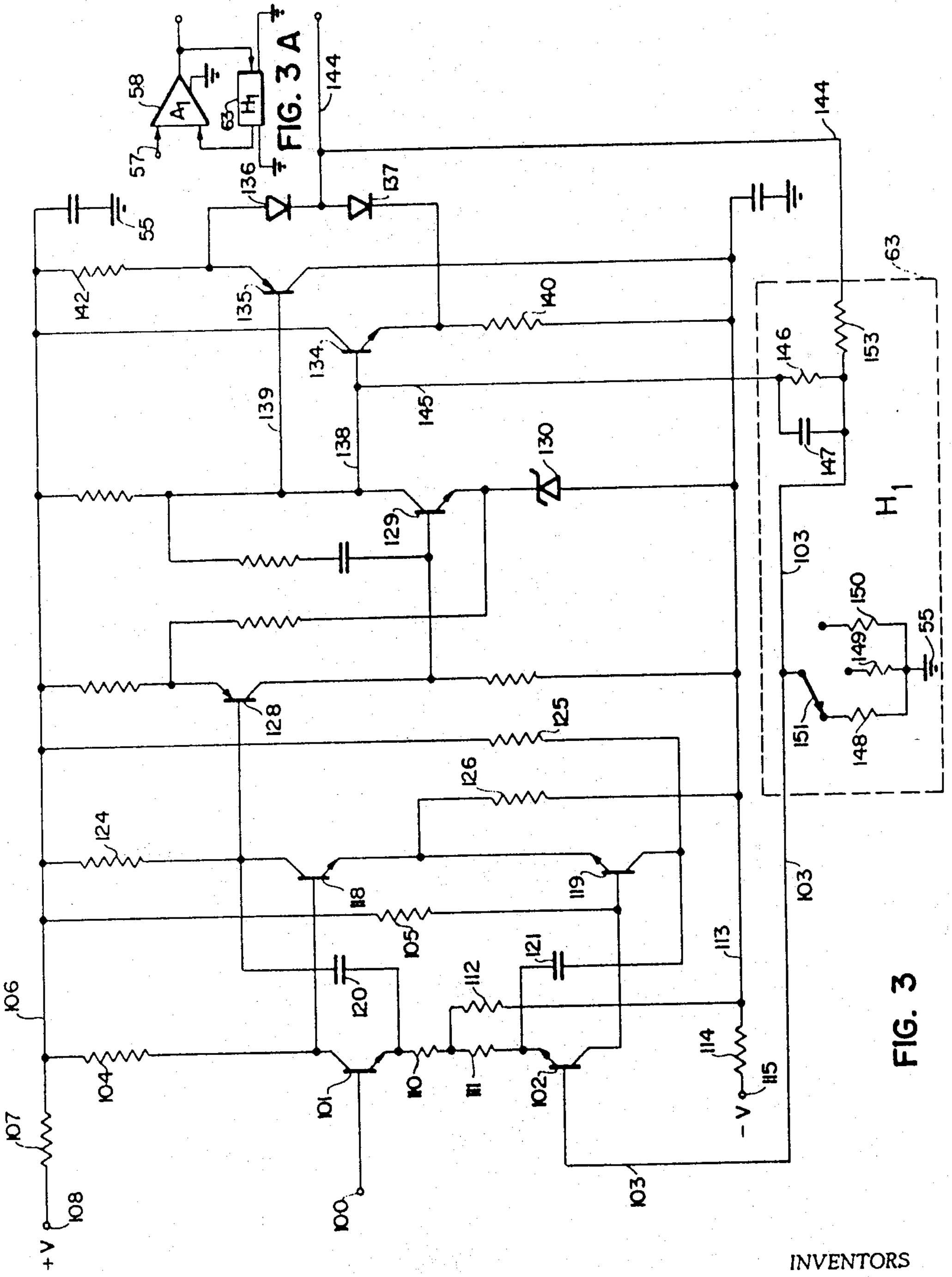
FIG. 3 is a circuit diagram of the preamplifier illustrated in block form in FIG. 1 and FIG 3*a*.

An exemplary preamplifier 58 and exemplary feedback circuit 63 therefor shown in block diagram form in FIG. 1 are illustrated in detail in FIG. 3. This amplifier is a transistorized potentiometric amplifier having a current limited output stage. An input terminal 100 is connected to the base of an NPN input transistor 101. A transistor 102 has its base connected to the feedback circuit 63 through a line 103. The collectors of the transistors 101 and 102 are connected through respective resistances 104 and 105 to a positive voltage supply bus 106. The bus 106 is connected through a resistance 107 to a positive voltage terminal 108. The emitters of the transistors 101 and 102 are connected together by means of resistances 110 and 111. The junction of the resistances 110 and 111 is connected through a resistance 112 to a negative voltage bus 113. The negative voltage bus 113 is connected through a resistance 114 to a negative voltage terminal 115. The transistors 101 and 102 function as a differential stage.

The collector of the transistor 101 is connected to the base of NPN transistor 118, and the collector of the transistor 102 is connected to the base of NPN transistor 119. Respective capacitors 120 and 121 interconnect the emitter of the transistor 101 with the collector of the transistor 118, and the emitter of the transistor 102 with the collector of the transistor 119. The transistors 118 and 119 are connected through respective resistances 124 and 125 to the positive voltage bus 106. The emitters of the transistors 118 and 119 are connected together and connected through a resistance 126 to the negative voltage bus 113. The transistors 118 and 119 serve as a differential stage. The collector of the transistor 18 is connected to the base of a PNP transistor 128, the collector of which is connected to the base of an NPN transistor 129. Suitable impedances are connected with the transistors 128 and 129 which are each connected in a single-ended configuration. The emitter of the transistor 129 is connected through a zener diode 130 to the negative voltage bus 113. The diode 130 provides a low impedance for the emitter and some collector voltage for the transistor 129.

The preamplifier shown in FIG. 3 has a current limited output stage including an NPN transistor 134, a PNP transistor 135, and diodes 136 and 137. The collector of the transistor 129 is connected through respective lines 138 and 139 to the bases of the transistors 134 and 135. The collector of the transistor 134 is connected directly to the positive voltage bus 106, and the emitter thereof is connected through a resistance 140 to the negative voltage bus 113. The collector of the transistor 135 is connected directly to the negative voltage bus 113, and the emitter thereof is connected through a resistance 142 to the positive voltage bus 106. The diodes 136 and 137 are connected across the emitters of the transistors 134 and 135. An output line 144 is connected to the junction of the diodes 136 and 137.

A line 145 is connected to the feedback circuit 63. The line 145 is connected through a resistance 146 and a capacitance 147 to the line 103 which is connected to the base of the transistor 102. Additionally, the line 103 is connected to gain changing resistances 148 through 150 by means of an adjustable switch arm 151. The output line 144 is connected through a resistance 153 to the line 103. The two connections through the lines 144 and 145 to the feedback circuit 63 provide split feedback when the preamplifier in FIG. 3 is operating as a differential amplifier. The connection through the line 144 and resistance 153 lowers the output impedance of the preamplifier (for example, from 50 ohms to around 4 ohms). When the output line 144 is tied to ground (during reset), no feedback is provided by the line 144.

The amplifier portion of the preamplifier shown in FIG. 3 functions substantially in a conventional manner to amplify the voltage applied to its input. The current limited output stage including the transistors 134 and 135, and the diodes 136 and 137 is a unity gain stage having a low output impedance with a current limited output. Thus, the preamplifier has a low output impedance for rapid charging of the reset capacitor 60 shown in FIG. 1. The transistors 134 and 135 function as complementary emitter-followers and, are coupled to the load through diodes so that current limiting occurs in both positive and negative directions. Ths stage provdes low output impedance for loads below the limiting value. The output may be short circuited without loading the input or damaging any elements. The stage therefore decouples overloads from the driver stage, and includes no storage elements (inductances or capacitances) that cause slow recovery from overloads. The diodes 136 and 137 may be either silicon diodes or germanium diodes. The resistances 140 and 142 determine the maximum load current. Resistances may be inserted between the collectors of the transistors 134 and 135 and the respective positive voltage bus 106 and negative voltage bus 113 to limit the power dissipation in the transistors, i.e., limit the collector-base voltage across the transistors, if desired. Also, a resistance may be connected between the collector of the transistor 129 and the line 139 connected with the base of the transistor 135 in order to adjust the bias current through the diodes 136 and 137 in order to further minimize the output impedance. The current limited output stage allows the preamplifier to remain in the linear region even with the output grounded. The output follows the input within the particular current range without overload. Generally amplifiers with current limited output stages encounter some overload before the limiting action commences. This is not the case with the preamplifier illustrated in FIG. 3.

Figure 4:
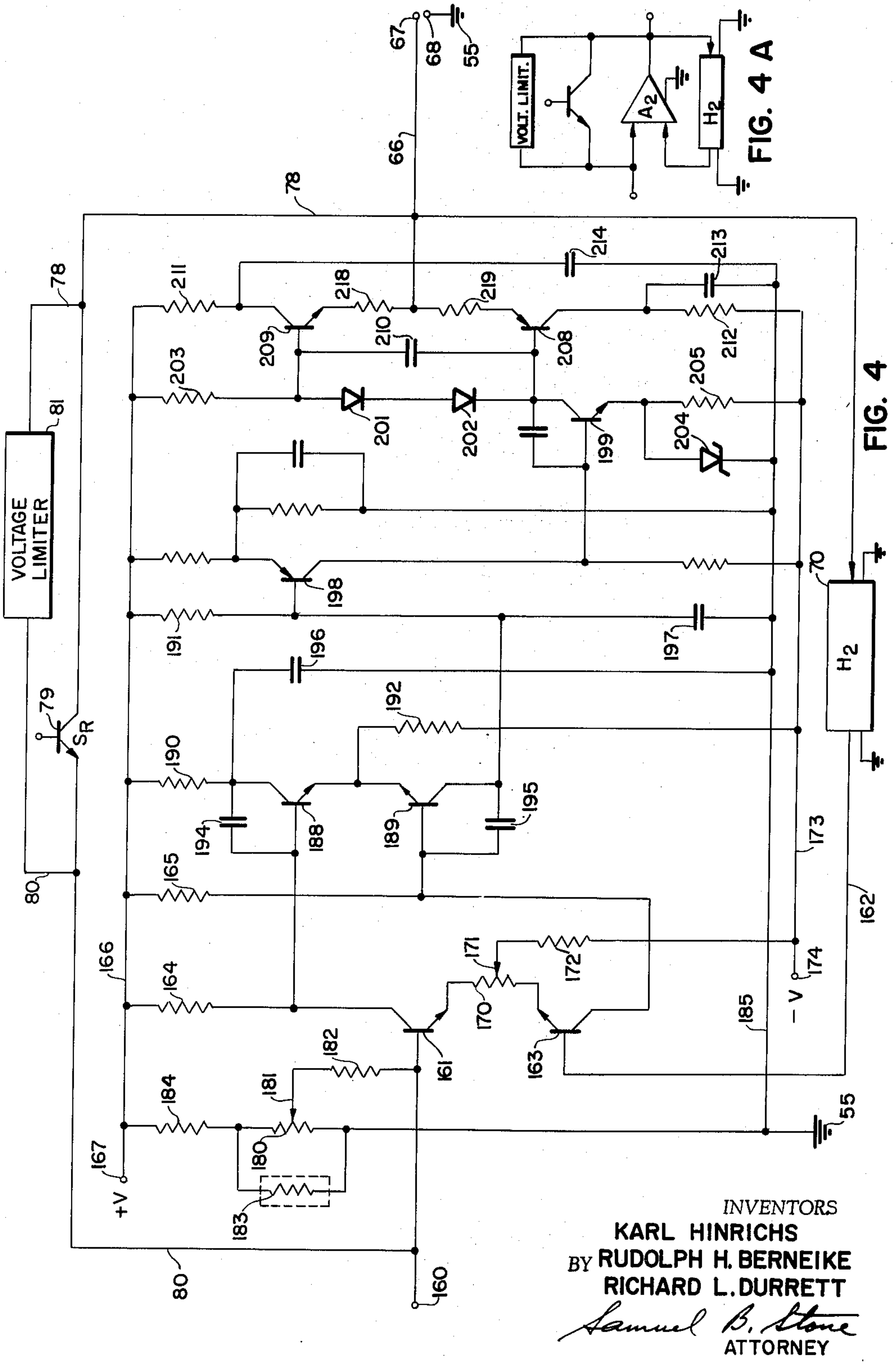
FIG. 4 is a circuit diagram of the post amplifier shown in block form in FIG. 1 and in FIG. 4*a*.

The circuit diagram of the post amplifier 62 shown in block diagram form in FIG. 1 is illustrated in detail in FIG. 4. This amplifier includes an input terminal 160 connected to the base of an NPN transistor 161. Feedback signals are applied from the feedback circuit 70 through a line 162 to the base of an NPN transistor 163. The transistors 161 and 163 serve as a differential stage. The collectors of the transistors 161 and 163 are connected through respective resistances 164 and 165 to a positive voltage bus 166. The positive voltage bus 166 is connected to a positive voltage terminal 167. The emitters of the transistors 161 and 163 are connected together through a potentiometer 170 which has an adjustable tap 171. The adjustable tap 171 of the potentiometer 170 is connected through a resistance 172 to a negative voltage bus 173 which in turn is connected to a negative voltage terminal 174. The tap 171 on the potentiometer 170 is initially adjusted during a reset period to compensate for the D.C. offset of the post amplifier.

A potentiometer 180 includes an adjustable tap 181 which is connected through a resistance 182 to the base of the transistor 161. A temperature compensating resistance 183 is connected across the potentiometer 180. The upper terminal of the potentiometer 180 is connected through a resistance 184 to the positive voltage bus 166, and the lower terminal of the potentiometer 180 is connected to a ground bus 185 which is grounded at 55. The resistance 184 and potentiometer 180 provide adjustment of the temperature compensation. The resistance 182 has a relatively high resistance (for example, one megohm) to prevent loading of the reset capacitor 60 (FIG. 1).

The collectors of the transistors 161 and 163 are connected to the bases of respective NPN transistors 188 and 189 which also serve as a differential stage. The collectors of the transistors 188 and 189 are connected through respective resistances 190 and 191 to the positive voltage bus 166. The emitters of the transistors 188 and 189 are connected together and connected through a resistance 192 to the negative voltage bus 173. Capacitors 194 and 195 are connected across the respective base-collector junctions of the transistors 188 and 189. The collectors of the transistors 188 and 189 are connected through respective capacitors 196 and 197 to the ground bus 185. The collector of the transistor 189 is connected to the base of a PNP transistor 198 connected to serve as a single-ended stage. The collector of the transistor 198 is connected to the base of an NPN transistor 199 which is also connected to serve as a single-ended stage. The collector of the transistor 199 is connected through a pair of diodes 201 and 202 and a resistance 203 to the positive voltage bus 166. The emitter of the transistor 199 is connected through a zener diode 204 to the ground bus 185, and through a resistance 205 to the negative voltage bus 173. The collector of the transistor 199 is connected to the base of a PNP transistor 208. The junction of the diode 201 and resistance 203 is connected to the base of an NPN transistor 209. The transistors 208 and 209 are connected as complementary symmetry emitter followers.

The bases of the transistors 208 and 209 are coupled through a capacitor 210. The collector of the transistor 209 is connected through a resistance 211 to the positive voltage bus 166. The collector of the transistor 208 is connected through a resistance 212 to the negative voltage bus 173, and through a capacitance 213 to the ground bus 185. The collector of the transistor 209 is connected through a capacitance 214 to the ground bus 185. The emitters of the transistors 208 and 209 are connected together by resistances 218 and 219. The junction of the resistances 218 and 219 are connected through the output line 66 to the output terminal 67. The output line 66 is connected through the switch 79 and voltage limiter 81 to the input terminal in the same manner as illustrated in FIG. 1. Likewise, the output line 66 is connected through the feedback circuit 70 to the base of the transistor 163. The post amplifier illustrated in FIG. 1 is an inverting amplifier and provides a high input impedance in order for the capacitor 60 to be small without giving excessive droop within the signal period. This amplifier functions in a substantially conventional manner to amplify the signal applied to its input. The diodes 201 and 202 provide forward bias for the transistors 208 and 209. The resistances 218 and 219 limit this forward bias in order to prevent the transistors 208 and 209 from being damaged.

Figures 5, 5A:
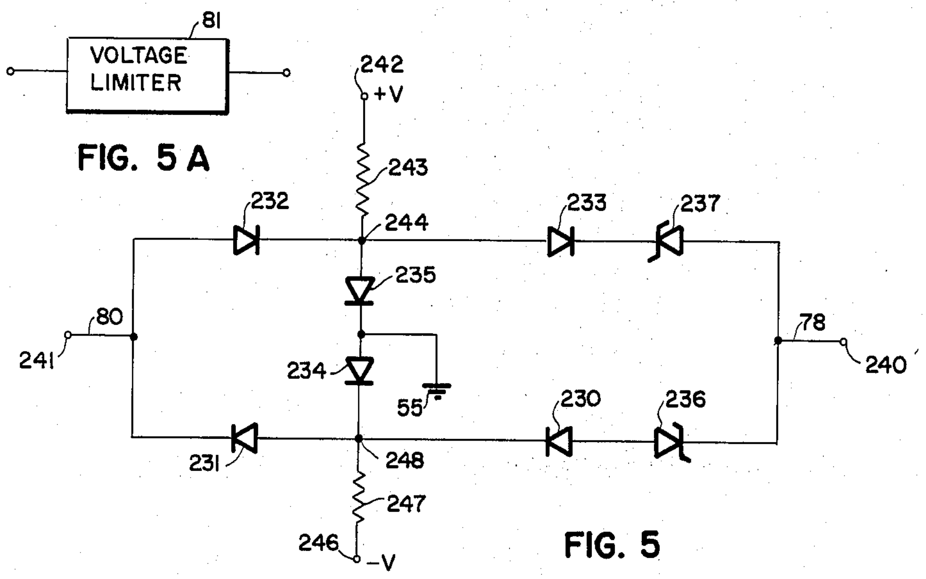
FIG. 5 illustrates the voltage limiter shown in block form in FIG. 1 and in FIG. 5*a*.

The voltage limiter 81 connected around the post amplifier 62 is illustrated in detail in FIG. 5. The post amplifier 62 is an inverting amplifier (i.e., negative algebraic gain) making it possible to utilize nonlinear operational feedback around this amplifier with zener diodes. The zener diodes limit the output of the amplifier and prevent the inputs from being overdriven. By utilizing the voltage limiter illustrated in FIG. 5, it is impossible to overdrive the post amplifier 62 from a current limited source (amplifier 58). When greater than a full scale signal occurs, the output of the amplifier 62 rises until the voltage limiter breaks down and provides feedback to the input of the amplifier 62. This action prevents the low frequency energy storage elements in the amplifier 62 from being charged and inhibiting recovery. Since the output of the preamplifier 58 is current limited, the feedback through the voltage limiter 81 has no difficulty preventing the input of the amplifier 62 from being overdriven. It is essential for recovery from an over-full scale channel that the roll-off capacitors within the amplifier 62 are prevented from being charged and thereby slowing recovery.

The voltage limiter 81 is used as a passive non-linear feedback network around the amplifier 62 to amplitude limit its output, and to prevent saturation thereof when this limit is exceeded. The prevention of saturation insures the amplifier's rapid recovery to linear operation when the input overload condition is removed. The particular circuit illustrated has a minimal effect on the linear feedback network 70 (FIGS. 1 and 6) which is simultaneously utilized in parallel. The voltage limiter illustrated in FIG. 5 includes diodes 230 through 235. The diodes 231 and 232 preferably are fast recovery (low capacitance) and low leakage silicon diodes. Diodes 230, and 233 through 235 may be either silicon or germanium diodes of moderately low leakage. Zener diodes 236 and 237 also are employed. The diodes 230, 231, 234 and 236 are employed for positive limiting, and the diodes 232, 233, 235 and 237 are used for negative limiting.

The voltage limiter is a bipolar limiter, but may be converted to a unipolar amplitude limiter by eliminating either the positive limiting or the negative limiting diodes. An input terminal 240 is connected through the line 78, diodes 237, 233, 232 and the line 80 to the output terminal 241; and through diodes 236, 230, 231 and the line 80 to the output terminal 241. A positive voltage terminal 242 is connected through a resistance 243 to a junction 244 between the diodes 232 and 233. A negative voltage terminal 246 is connected through a resistance 247 to a terminal 248 between the diodes 230 and 231. The diodes 234 and 235 are connected in series between the terminals 244 and 248, and the junction between these two diodes is connected to ground at 55. The resistances 243 and 247 and their associated voltage sources serve as current sources. Such a voltage limiter is disclosed and claimed in copending U.S. patent application Serial No. 290,778 entitled "Amplifier Passive Nonlinear Feedback Voltage Limiting Network," filed by Barret B. Weekes concurrently herewith and assigned to the assignee of the present invention.

Figures 6, 6A:
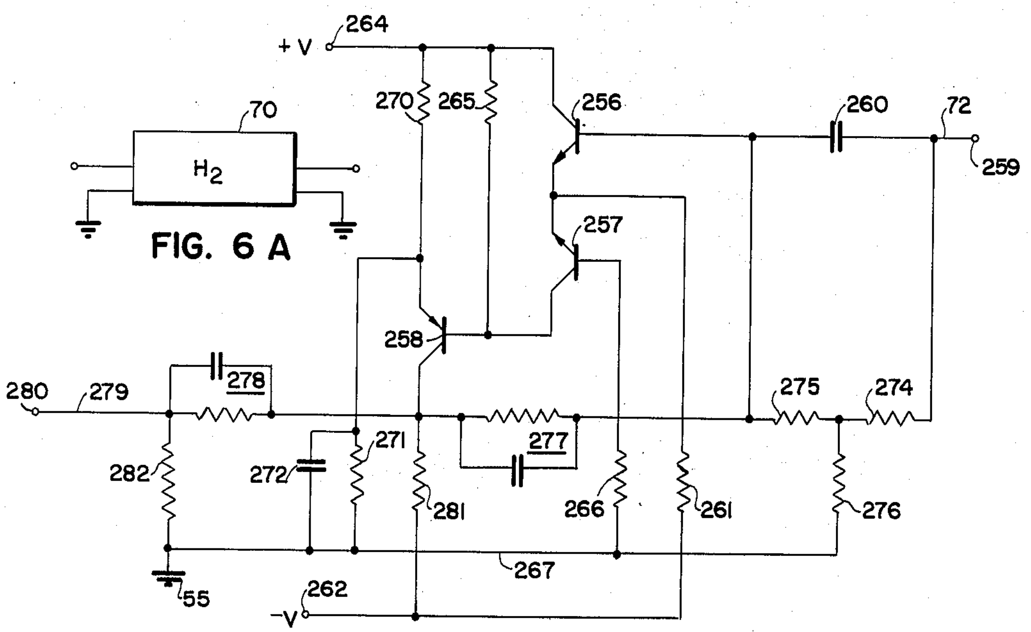
FIG. 6 illustrates the feedback circuit for the post amplifier shown in block form in FIG. 1 and in FIG. 6*a*.

FIG. 6 illustrates the feedback circuit 70 shown in FIG. 1 connected to the post amplifier 62. In order to make the amplifier 62 an inverting potentiometric amplifier, this feedback circuit 70 is an active network which inverts the feedback signal. This feedback circuit includes a pair of NPN transistors 256 and 257 connected as a differential stage, and a PNP transistor 258 connected single-ended. An input terminal 259 is connected through the line 72 and a capacitance 260 to the base of the transistor 256. The emitters of the transistors 256 and 257 are connected together, and connected through a resistance 261 to a negative voltage terminal 262. The collector of the transistor 256 is connected to a positive voltage terminal 264, and the collector of the transistor 257 is connected through a resistance 265 to the positive voltage terminal 264. The base of the transistor 257 is connected through a resistance 266 to a ground bus 267 which is grounded at 55. The emitter of the transistor 258 is connected through a resistance 270 to the positive voltage terminal 264. The emitter of the transistor 258 also is connected through the parallel combination of a resistance 271 and a capacitance 272 to the ground bus 267.

The input line 72 is connected to one leg of a resistive "Y" network including resistances 274 through 276, the remaining legs of which are connected to the ground bus 267 and to the base of the transistor 256. The collector of the transistor 258 is connected through an RC network 277 to the base of the transistor 256, and through an RC network 278 to an output line 279. The line 279 is connected to an output terminal 280 which in turn is connected to an input of the post amplifier 62. The collector of the transistor 258 is connected through a resistance 281 to the negative voltage terminal 262. The output line 279 is connected through a resistance 282 to ground 55. The active components (transistors) in the feedback network 70 in FIG. 6 are utilized in order to provide phase inversion, and the passive components thereof are employed to shape the closed loop gain characteristic of the feedback network.

Although an exemplary embodiment of the present invention has been disclosed and discussed, it will be understood that other applications and circuit arrangements are possible and that the embodiment disclosed may be subjected to various changes, modifications and substitutions without necessarily departing from the spirit of the invention.

What is claimed is:

1. A wide-band low pass pulse amplifier having only electromagnetic coupling between the input and output thereof comprising:
- an input circuit including at least first and second input terminals and at least a first and a second switch means,
- first and second transformers each having a primary winding and a secondary winding,
- means coupling at least a portion of the primary winding of said first transformer in series with at least a portion of the secondary winding of said second transformer, and in series with said first switch means and to said first and second input terminals,
- said second switch means of said input circuit being connected across said first and second input terminals,
- a first amplifying means,
- a first impedance means,
- a second amplifying means having at least one output and one input terminal,
- means coupling said first amplifying means to at least a portion of the secondary winding of said first transformer, and through said first impedance means to an input terminal of said second amplifier,
- third switch means,
- means coupling an output terminal of said second amplifier in series with the primary winding of said second transformer, said third switch means and a reference terminal, said output terminal of said second amplifier and said reference terminal serving as the output terminals of said pulse amplifier,
- fourth switch means coupled from an output terminal to an input terminal of said second amplifier,
- a voltage limiter connected from an output terminal to an input terminal of said second amplifier, and
- means coupled with said switch means for controlling the operation thereof to establish voltage references within said pulse amplifier, to cause amplification of a pulse signal, and to cause discharge of any built-up excitation currents.

2. A pulse amplifier as in claim 1 wherein said impedance means comprises a storage capacitance.

3. A pulse amplifier as in claim 1 wherein means connected to said switch means for applying timed switching signals thereto so that said switch means are in closed or open states as defined below during reset, signal and discharge periods which constitute a cycle of operation
- reset period—said first, second, third and fourth switch means are closed,
- signal period—said first and third switch means are closed, and said second and fourth switch means are open, and
- discharge period—said first and third switch means are open, and said second and fourth switch means are closed.

4. A pulse amplifier as in claim 1 wherein means connected to said switch means for applying timed switching signals thereto so that said switch means are operated in substantially the following sequence throughout a period of operation,
- the second and fourth switch means are closed,
- the first and third switch means are closed,
- the fourth switch means is opened,
- the second switch means is opened,
- the fourth switch means is closed, the first switch means is opened, and the second switch means is closed, and
the third switch means is opened.

5. A pulse amplifier as in claim 1 wherein means connected to said switch means for applying timed switching signals thereto so that said switch means are operated in the following sequence throughout a period of operation,
the second and fourth switch means are closed,
the first and third switch means are closed,
the fourth switch means is opened,
the second switch means is opened,
the fourth switch means is closed and the first switch means is opened,
the second switch means is closed, and
the third switch means is opened.

6. A pulse amplifier as in claim 1 including a plurality of input data channels each having at least a pair of electrical conductors,
fifth switch means connecting a first conductor of each channel to said first input terminal of said pulse amplifier,
sixth switch means connecting a second of the conductors of each channel to said second input terminal of said pulse amplifier, and
means for controlling the operation of the fifth and sixth switch means of each channel to close these switch means of a selected channel when said first and third switch means are closed and said second and fourth switch means are open.

7. A pulse amplifier as in claim 6 wherein means connected to said switch means for applying timed switching signals thereto so that said switch means are operated as set forth below during reset, signal and discharge periods to define a cycle of operation,
reset period—said first, second, third, fourth and sixth switch means are closed, and said fifth switch means is open,
signal period—said first, third, fifth and sixth switch means are closed, and said second and fourth switch means are open, and
discharge period—said first, third, fifth and sixth switch means are open, and said second and fourth switch means are closed.

8. A pulse amplifier as in claim 6 wherein means connected to said switch means for applying timed switching signals thereto so that the first, second, third and fourth switch means and the fifth and sixth switch means of a single channel are operated in substantially the following sequence during one period of operation,
said second and fourth switch means are closed,
said first, third and sixth switch means are closed,
said fourth switch means is opened,
said second switch means is opened and said fifth switch means is closed,
said fourth switch means is closed, and said fifth and sixth switch means are opened, said first switch means is opened, and said second switch means is closed, and
said third switch means is opened .

9. A pulse amplifier as in claim 6 wherein means connected to said switch means for applying timed switching signals thereto so that said first, second, third and fourth switch means and said fifth and sixth switch means of a single channel are operated in substantially the following sequence during a single period of operation,
said second and fourth switch means are closed,
said first, third and sixth switch means are closed,
said fourth switch means is opened,
said second switch means is opened,
said fifth switch means is closed,
said fifth and sixth switch means are opened, said second and fourth switch means are closed and said first switch means is opened, and
said third switch means is opened.

10. An amplifier for the precision amplification of signals having a frequency range from zero to a high frequency and having conductive and electrostatic isolation between the input and output thereof comprising
first and second input terminals,
first and second transformers each having at least one primary winding and at least one secondary winding,
first and second switches,
means providing a series circuit comprising said first input terminal, said first switch, at least a portion of the primary winding of said first transformer, at least a portion of the secondary winding of said second transformer, and said second input terminal,
means connecting said second switch across said input terminals,
first and second output terminals,
amplification means for amplifying signals passed by said first transformer coupled between the secondary winding of said first transformer and said first output terminal,
a third switch,
means coupling said first output terminal, at least a portion of the primary winding of said second transformer, said third switch and said second output terminal in series, and
means for controlling the operation of said switches to provide different intervals of operation, one interval providing signal amplification, by operating said switches in the following manner during three time intervals defining a cycle of operation;
first, closes said first, second and third switches,
second, retains said first and third switches closed, and opens said second switch, and
third, opens said first and third switches, and closes said second switch.

11. A wide-band low pass pulse amplifier having conductive and electrostatic isolation between the input and output thereof comprising
an input circuit including at least first and second input terminals and at least a first and a second switch means,
first and second transformers each having a primary winding and a secondary winding,
means coupling at least a portion of the primary winding of said first transformer in series with at least a portion of the secondary winding of said second transformer, and in series with said first switch means and to said first and second input terminals,
said second switch means being connected across said first and second input terminals,
a first amplifying means,
a first impedance means,
a second amplifying means having at least one output and one input terminal,
means coupling said first amplifying means to at least a portion of the secondary winding of said first transformer, and through said first impedance means to an input terminal of said second amplifier,
third switch means,
means coupling an output terminal of said second amplifier in series with the primary winding of said second transformer, said third switch means and a reference terminal, said output terminal of said second amplifier and said reference terminal serving as the output terminals of said pulse amplifier,
fourth switch means coupled from an output terminal to an input terminal of said second amplifier, and
said switch means being adapted to receive control signals which operate said switch means in the following manner during reset, signal and discharge intervals which define a cycle of operation reset interval—said first, second, third and fourth switch means are closed, signal interval—said first and third switch means are closed, and said second and fourth switch means are open, and discharge interval—said first and third switch means are open and said second and fourth switch means are closed.

References Cited by the Examiner

UNITED STATES PATENTS

| | | | |
|---|---|---|---|
| 3,059,228 | 10/1962 | Beck et al. | 179— 15 X |
| 3,152,319 | 10/1964 | Gordon et al. | 328—154 X |
| 3,158,759 | 11/1964 | Jasper | 328—151 X |
| 3,188,394 | 6/1965 | McMillan et al. | 179—15 |

ROY LAKE, *Primary Examiner.*

R. P. KANANEN, *Assistant Examiner.*